United States Patent

Ettel

[11] 4,041,870
[45] Aug. 16, 1977

[54] CIRCUIT ARRANGEMENT FOR SUPPLYING CLOCK PULSES TO A PROJECTILE FUZE

[75] Inventor: Godwin Ettel, Zurich, Switzerland

[73] Assignee: Werkzeugmaschinenfabrik Oerlikon-Buhrle AG, Zurich, Switzerland

[21] Appl. No.: 638,060

[22] Filed: Dec. 5, 1975

[30] Foreign Application Priority Data

Dec. 10, 1974 Switzerland ............... 16418/74

[51] Int. Cl.² .............. F42C 19/12; F42B 9/00; F42C 11/06; F42C 9/00
[52] U.S. Cl. ............... 102/70.2 GA; 331/113 R
[58] Field of Search ............. 331/113 R; 102/70.2 P

[56] References Cited

U.S. PATENT DOCUMENTS

| | | | |
|---|---|---|---|
| 3,664,118 | 5/1972 | Walton | 331/113 R |
| 3,702,446 | 11/1972 | Steudel | 331/113 R |
| 3,703,145 | 11/1972 | Burkhardt | 102/70.2 P |
| 3,788,226 | 1/1974 | Fillmore et al. | 102/70.2 P |
| 3,942,134 | 2/1976 | Schade, Jr. | 331/113 R |
| 3,949,322 | 4/1976 | Morita | 331/113 R |

Primary Examiner—Verlin R. Pendegrass
Assistant Examiner—Thomas H. Webb
Attorney, Agent, or Firm—Werner W. Kleeman

[57] ABSTRACT

A circuit for supplying clock or timing pulses to a projectile fuze, comprising an astable multivibrator possessing field-effect transistors and a supply capacitor for controlling and supplying the multivibrator. Between the multivibrator and the supply capacitor there is connected in circuit a resistor and parallel to said resistor there is connected a trimmer capacitor for stabilizing the frequency of the clock pulses.

3 Claims, 5 Drawing Figures

CIRCUIT ARRANGEMENT FOR SUPPLYING CLOCK PULSES TO A PROJECTILE FUZE

BACKGROUND OF THE INVENTION

The present invention relates to a new and improved construction of circuit arrangement or circuit for supplying or delivering clock or timing pulses to a projectile fuze.

There are already known to the art such type devices which, however, do not afford the requisite accuracy with respect to maintaining a certain time-delay.

SUMMARY OF THE INVENTION

It is a primary object of the present invention to provide an improved circuit for delivering clock pulses to a projectile fuze in a manner not associated with the aforementioned drawbacks and limitations of the prior art proposals.

Another and more specific object of the present invention aims at the provision of a novel circuit by means of which there can be realized the desired time-delay more accurately than previously possible and there can be realized a saving in current.

Now in order to implement these and still further objects of the invention, which will become more readily apparent as the description proceeds, the invention is manifested by the features that there is provided an astable multivibrator equipped with field-effect transistors and a supply capacitor for controlling and supplying the multivibrator. Between the multivibrator and the supply capacitor there is connected in circuit a resistor. Further, there is connected in parallel to the resistor a trimmer or balancing capacitor for stabilizing the frequency of the clock pulses.

BRIEF DESCRIPTION OF THE DRAWINGS

The invention will better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
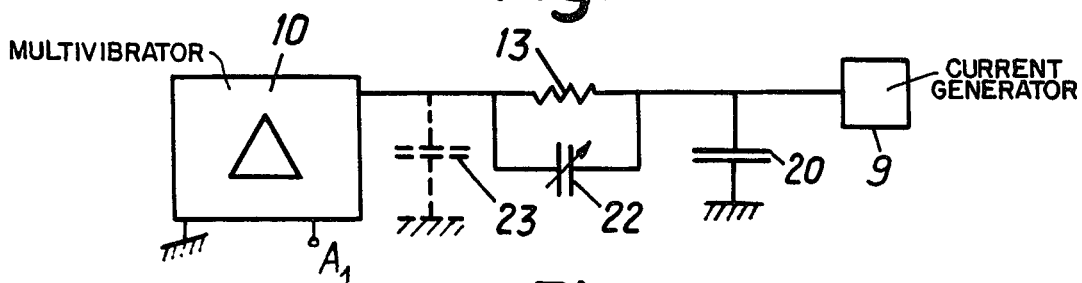
FIG. 1 is a schematic circuit diagram of the entire apparatus of the invention for the supply of clock or timing pulses.

Describing now the drawings, according to the circuit diagram of FIG. 1 a multivibrator 10 having an output $A_1$ for the delivery of clock or timing pulses is connected via a parallel connected RC-element, i.e. a resistor 13 and a capacitor 22, with a supply capacitor 20. The supply capacitor 20 can be charged by a current generator 9 upon firing the projectile. The significance of the RC-element will be explained more fully hereinafter. Current generator 9 may be a conventional component in this art and may comprise, for instance, an inductance coil, a permanent magnet and a soft iron core. During the firing acceleration of the projectile there occurs a relative displacement or shifting of these components for producing an induced current in the induction coil. Due to this induced current the supply capacitor 20 is charged. Details of one possible construction of current generator are disclosed in the commonly assigned, copending U.S. application Ser. No. 637,639, filed Dec. 4, 1975, of Panayotis Karayannis, entitled "Ignition Current Generator For An Electrical Projectile Fuze", the disclosure of which is incorporated herein by reference.

Figure 2:
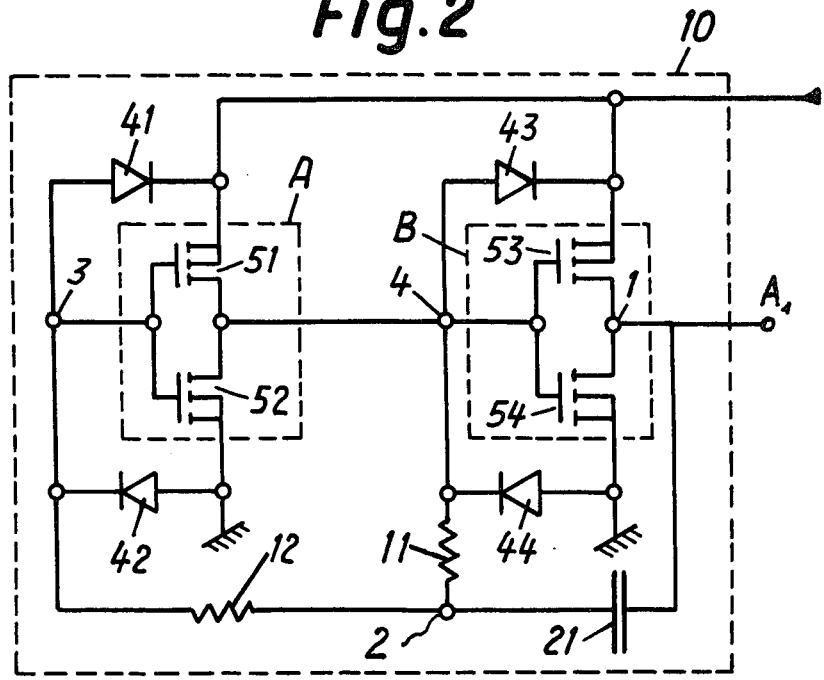
FIG. 2 is a schematic circuit diagram of a multivibrator.

Continuing, and turning to the circuit diagram of multivibrator as shown in FIG. 2 it will be recognized that the same comprises four field-effect transistors 51, 52, 53 and 54. Each two respective ones of the field-effect transistors are connected in series, such as the field-effect transistors 51 and 52 and the field-effect transistors 53 and 54. The field-effect transistors 51, 52, 53 and 54 are connected with the current supply, i.e. via the RC-element 13, 22 with the supply capacitor 20 and also with ground. The gates of the transistors 51, 52, 53, 54 are connected via the diodes 41, 43 with the current supply and via the diodes 42, 44 with ground. Both of the transistors 51, 52 form a first inverter A and both of the transistors 53, 54 form a second inverter B. The output 4 of the inverter A, which at the same time constitutes the input of the inverter B, is connected via a resistor 11 and the junction point 2 with one terminal of a capacitor 21. The output 1 of the inverter B is connected with the other terminal or side of the capacitor 21. The input 3 of the inverter A is connected via a resistor 12 and the junction point 2 with the first terminal or side of the capacitor 21.

The transistors 51 and 53 are n-channel transistors or MOS's and the transistors 52 and 54 are p-channel transistors or MOS's. Consequently, upon application of a voltage to the inputs 3, 4 of both inverters A and B the n-channel transistors 51 and 53 are rendered non-conductive i.e. block, whereas the p-channel transistors 52 and 54 are conductive. On the other hand, if the voltage at the inputs 3,4 of both of the inverters A and B drops to a predetermined value, then the operating state reverses, i.e. the n-channel transistors 51 and 53 become conductive and the p-channel transistors 52 and 54 become non-conductive i.e. block.

Figure 5:
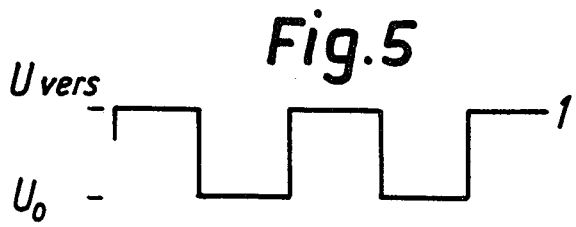
FIG. 5 is a diagram showing curves of the voltage at different locations of the multivibrator.
Figure 5:
Figure 5:
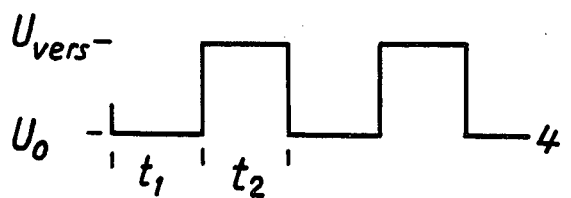

The voltage curve at the outputs 1 and 4 of both inverters B and A as well as at the input 3 of the inverter A will be apparent by referring to FIG. 5.

The mode of operation of the above-described circuitry is as follows:

In the event that current flows through the transistors 52 and 53 and no current flows through the transistors 51 and 54, then there appears at the output 1 of the inverter B and at the input 3 of the inverter A the supply voltage $U_{vers}$ and at the input 4 there does not appear any voltage, as the same is apparent from the graphs of FIG. 5 at the start of the oscillation time $t_1$. The output 1 is connected in circuit via the transistor 53 with the current supply and the input 4 is connected via the transistor 52 with ground. Since the supply voltage $U_{vers}$ appears at the output 1, the one side of the capacitor 21 can be positively charged to the supply voltage $U_{vers}$. The other side of the capacitor 21 can discharge via the resistor 11 and the transistor 52, and the voltage at the input 3 drops according to the exponential curve represented by the following equation:

Equation (1):

$$U_{um} = U_{vers}(e^{-t_1/RC}).$$

In the above Equation (1) $U_{um}$ represents the switching voltage for the inverters A, B, the symbol $R$ represents the resistances of the resistors 11 and 12, the symbol $C$ the capacitance of the capacitor 21, and the symbol $t_1$ the time between two switching operations.

As soon as the voltage at the input 3 has dropped to the switching voltage, then both of the inverters A and B are switched. Current can now flow through the transistors 51 and 54, whereas no current flows any longer through the transistors 52 and 53. The voltage at the output 1 thus drops to the voltage $U_o$. The one side or terminal of the capacitor 21 can discharge across the transistor 54, the other side of the capacitor 21 can charge via the transistor 51 and the resistor 11. The voltage immediately reaches the value $U_{vers}$ at the input 4. At the input 3 the voltage rises according to the following equation:

Equation (2):

$$U_{um} = U_{vers}(1 - e^{-t_2/RC}).$$

Since the oscillation period $T = t_1 + t_2$, there can be derived from the Equations (1) and (2) the following:

Equation (3):

$$T = -RC \left( \ln \frac{U_{um}}{U_{vers} - U_{um}} + \ln \frac{U_{vers} - U_{um}}{2U_{vers} - U_{um}} \right).$$

From this Equation it will be apparent that the oscillation period T is dependent upon the supply voltage $U_{vers}$. If there is provided a capacitor for the supply voltage $U_{vers}$, then it cannot be avoided that due to the removal of energy the voltage $U_{vers}$ of the capacitor will drop, and consequently there will be changed the oscillation period T.

The objective which should be realized with the present invention resides in the provision of a circuit wherein at least the mean or average oscillation period $T_m$ should be constant during a predetermined time, for instance the time from the moment of firing a projectile until its detonation, amounting to for instance approximately 5 to 10 seconds. There should be taken into account that the supply capacitor 20 of the current supply is not always charged to the same output voltage. A numerical example should render this problem clearer. Assuming that the voltage $U_{vers}$ to which the supply capacitor 20 has been charged can fluctuate by 10%, then it is required that the time until detonation of the projectile, for instance amounting to 5.3 seconds, is exactly maintained within 1% to 2%.

Figure 3:
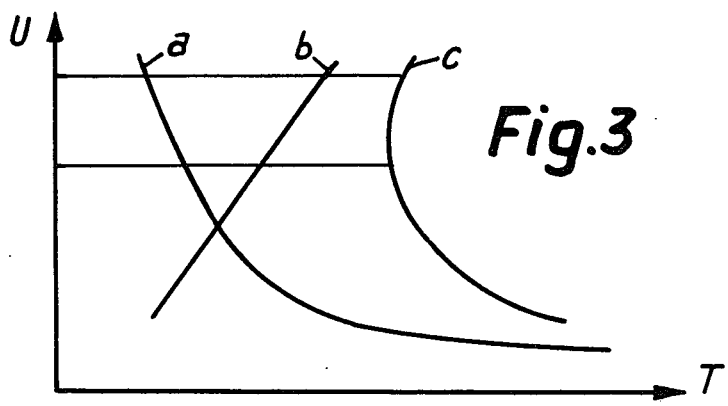
FIG. 3 is a diagram showing the course of the supply voltage as a function of time.

Now in order to solve this objective, according to FIG. 1, an ohmic resistance 13 is connected between the multivibrator 10 and the supply capacitor 20, and further, there is connected in parallel with such ohmic resistance or resistor 13 a trimmer or balancing capacitor 22. The operation of such circuit configuration will be apparent from FIG. 3. The supply voltage $U_{vers}$ drops under the influence of the resistor 13. The course of such voltage brings about a change of the oscillation time according to curve a. The trimmer or balancing capacitor 22 brings about a correction according to the curve b. From both of these curves a and b there results the curve c which represents the frequency and therefore the oscillation time T of the multivibrator 10.

The trimmer or balancing capacitor 22 is matched to the internal capacitance of the multivibrator 10, represented by broken lines in FIG. 1 as the equivalent capacitance 23.

In order to further understand the invention reference will be made to individual characteristics of the multivibrator 10. The oscillation period T is dependent upon the performance of the transistors 51, 52, 53, 54. Upon reaching the switching threshold the transistors 51, 52, 53, 54 are rendered conductive, and specifically for such length of time until there is attained the required switching current $I_D$. This switching current $I_D$ can be represented by the following Equation:

Equation (4):

$$I_D = \mu \, C_{ox} \frac{Z}{L} (U_G - U_T) U_D - \frac{1}{2} U_D^2$$

In this Equation the following symbols have the following meaning:
$U_G$ = gate voltage
$U_T$ = threshold voltage
$U_D$ = transistor voltage
$Z$ and $L$ = dimensions of the transistor (general width and general length)
$C_{ox}$ = transistor capacitance.

This Equation of the switching current represents a differential equation from which there will be apparent the dependency of the oscillation period T upon the supply voltage. Depending upon the size of the trimmer or balancing capacitor 22 and the internal capacitance 23 the oscillation period T can exponentially increase or decrease with increasing supply voltage $U_{vers}$.

After switching of the transistors there occurs the exponential discharge of the capacitor 21. This discharge time is shorter, when with higher supply voltage the switching voltage becomes smaller and the capacitor 21 is less intensely charged, than with lower supply voltage and relatively great switching voltage the capacitor 21 is more intensely charged.

By suitably tuning or matching the capacitances 21 and 22 there is possible a variation of the frequency as a function of the supply voltage in such a manner that apart from the properties of the employed complementary metal-oxide-semiconductor circuit (C-MOS) it is also possible to correct the circuit construction in such a manner that over certain multiples of the fundamental oscillations with a known size of the supply capacitor 20 there can be obtained a large time-constant.

Figure 4:
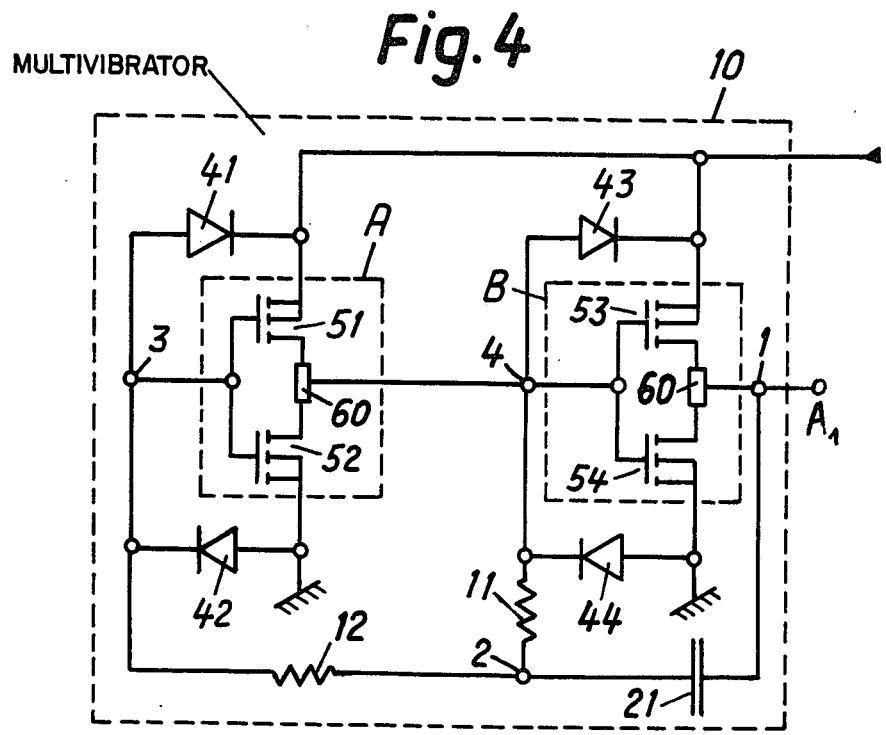
FIG. 4 is a circuit diagram of a second exemplary embodiment of multivibrator.

According to a modified exemplary embodiment as illustrated in the circuit arrangement of FIG. 4 a respective ohmic resistance or resistor 60 is arranged between both of the transistors 51, 52 and also between the transistors 53, 54, the function of which resistors 60 is analogous to the resistor 13. With these two resistors 60 it is possible, however, not only to choose their size i.e. resistance value, but also the tapping-off of the output 1 and 4 respectively.

While there are shown and described present preferred embodiments of the invention, it is to be distinctly understood that the invention is not limited thereto, but may be otherwise variously embodied and practiced within the scope of the following claims.

Accordingly, what is claimed is:

1. A circuit for supplying clock pulses for a projectile fuze comprising:

a. a current generator producing an induced current during firing acceleration of the projectile;
b. a supply capacitor charged by said current generator;
c. an astable multivibrator with field-effect transistors supplied with a supply voltage and controlled by said supply capacitor after acceleration of the projectile;
d. a resistor connected in circuit between the astable multivibrator and the supply capacitor preventing rapid dropping of the supply voltage; and
e. a trimmer capacitor connected in parallel with said resistor for stabilizing the frequency of the clock pulses by supplying a further supply voltage.

2. The circuit as defined in claim 1, wherein said field-effect transistors total at least four in number, said multivibrator comprises two inverters containing said field-effect transistors, each inverter incorporating two said field-effect transistors, and a respective resistor connected in circuit between each two transistors of each inverter.

3. A circuit for supplying clock pulses for a projectile fuze comprising:
a. an astable multivibrator provided with field-effect transistors;
b. a supply capacitor for supplying and controlling the astable multivibrator;
c. a current generator producing an induced current during firing acceleration of the projectile for charging said supply capacitor;
d. a resistor connected in circuit between the astable multivibrator and the supply capacitor;
e. a trimmer capacitor connected in parallel with said resistor for stabilizing the frequency of the clock pulses.

* * * * *